US007649218B2

(12) United States Patent
Bang (10) Patent No.: US 7,649,218 B2
(45) Date of Patent: Jan. 19, 2010

(54) LATERAL MOS TRANSISTOR AND METHOD FOR MANUFACTURING THEREOF

(75) Inventor: Ki-Wan Bang, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 99 days.

(21) Appl. No.: 11/945,074

(22) Filed: Nov. 26, 2007

(65) Prior Publication Data
US 2008/0128819 A1    Jun. 5, 2008

(30) Foreign Application Priority Data
Dec. 5, 2006    (KR) ............. 10-2006-0122200

(51) Int. Cl.
*H01L 29/78* (2006.01)
(52) U.S. Cl. ............. 257/288; 257/E21.546; 257/330; 438/270; 438/430
(58) Field of Classification Search ......... 257/368, 257/E27.091, E29.201, E29.257, 506, 510, 257/330, 332, 374, E21.545, E21.546, 288; 438/430, 433, 427, 270
See application file for complete search history.

(56) References Cited
U.S. PATENT DOCUMENTS

| 6,046,103 | A  | * | 4/2000 | Thei et al. ........... | 438/624 |
| 7,081,378 | B2 | * | 7/2006 | Zheng et al. .......... | 438/135 |
| 2003/0168680 | A1 | * | 9/2003 | Hsu ............... | 257/296 |

* cited by examiner

*Primary Examiner*—Victor A Mandala
*Assistant Examiner*—Scott Stowe
(74) *Attorney, Agent, or Firm*—Sherr & Vaughn, PLLC

(57) ABSTRACT

A lateral MOS transistor that can include a first device isolating layer formed in a semiconductor substrate; a second device isolating layer formed in the semiconductor substrate, the second device isolation layer having a different width than the first device isolation layer and also having an etched groove provided therein; a gate insulating layer formed in the etched groove; a gate electrode formed over the gate insulating layer; and a source/drain region horizontally arranged in the semiconductor substrate adjacent to the gate electrode.

20 Claims, 7 Drawing Sheets

LATERAL MOS TRANSISTOR AND METHOD FOR MANUFACTURING THEREOF

The present application claims priority under 35 U.S.C. 119 to Korean Patent Application No. 10-2006-0122200 (filed on Dec. 5, 2006), which is hereby incorporated by reference in its entirety.

BACKGROUND

Aspects of semiconductor technology have focused on fabricating semiconductor devices having high integration and high performance. Production of highly integrated semiconductor devices may result in a reduction in the gate length of a MOS transistor, and the source/drain region thereof.

A semiconductor device having high integration may include a gate electrode, an interlayer dielectric layer, a contact electrode, and a multi-layer wiring that are vertically stacked on and/or over a semiconductor substrate. A chemical mechanical polishing (CMP) process may then be performed on the structure.

Figure 1:
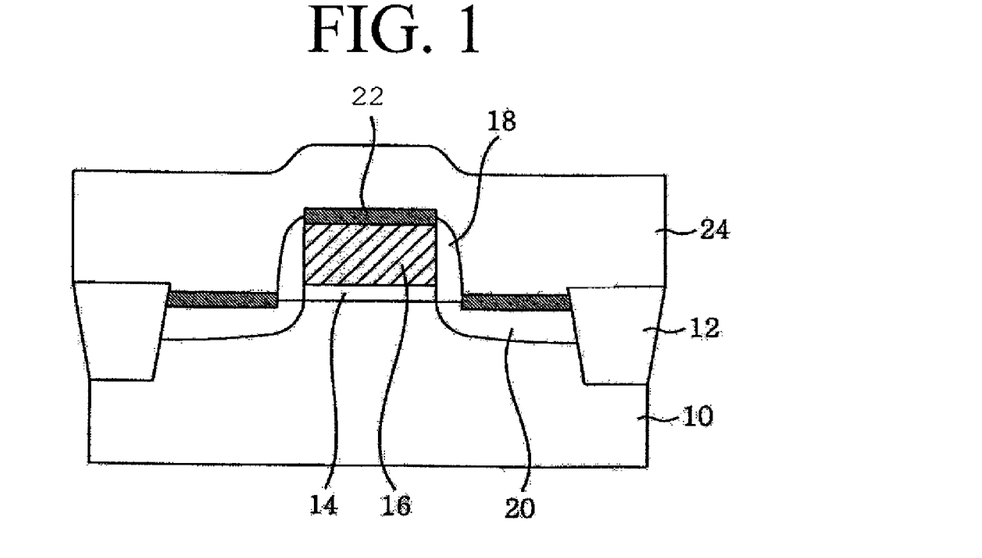
FIG. 1 illustrates a MOS transistor structure.

As illustrated in example FIG. 1, a method for manufacturing the MOS transistor may include performing a shallow trench isolation (STI) process on silicon semiconductor substrate 10 to form device isolating layer 12. A well-region may be formed by ion-implanting a low concentration impurity dopant such as a p-type impurity dopant into substrate 10 where device isolating layer 12 is formed.

An impurity dopant such as an n-type impurity dopant can then be ion-implanted into the well-region of semiconductor substrate 10 to form a threshold voltage control region.

Gate insulating layer 14, which may be composed of silicon oxide film ($SiO_2$) may be thinly deposited on and/or over the overall surface of semiconductor substrate 10. Next, a doped polysilicon, as a gate conductive layer having a predetermined thickness, may then be deposited on and/or over gate insulating layer 14. The gate conductive layer may then be patterned using a dry etching process, using a gate mask, to form gate electrode 16. At this time, gate insulating layer 14 may also be patterned.

A low concentration impurity dopant such as an n-type impurity dopant may then be ion-implanted to form a LDD region. An insulating layer composed of a silicon nitride film (SiN) may then be deposited on and/or over the overall surface of structure. The insulating layer may then be etched using an etching process such as an etch back to form a pair of spacers 18 on the side walls of gate insulating layer 14 and gate electrode 16.

A high concentration impurity dopant such as an n-type impurity dopant may then be ion-implanted using gate electrode 16 and spacer 18 as masks to form source/drain region 20 in semiconductor substrate 10.

Thereafter, a metal layer such as titanium (Ti) for silicide, may then be deposited on and/or over the overall surface of the structure and an annealing process may be performed thereon to form titanium silicide (TiSi) film 22 on and/or over the uppermost surface of gate electrode 16 and the uppermost surface of source/drain region 20.

Interlayer dielectric layer 24 composed of a dielectric material such as phosphor-silicate glass (PSG), boro-silicate glass (BSG), boro-phospho silicate glass (BPSG) or undoped silicate glass (USG) may be deposited on and/or over the overall surface of semiconductor substrate 10 and the surface of interlayer dielectric layer 24 may be planarized using a chemical mechanical polishing (CMP) process.

Thereafter, a contact hole etching process may be performed on interlayer dielectric layer 24 to form a contact hole exposing the uppermost surface of silicide film 22 of gate electrode 16 or the uppermost surface of silicide film 22 of source/drain region 20. A conductive layer composed of a metal such as tungsten (W) may then be gap-filled in the contact hole and planarized using a chemical mechanical polishing (CMP) process to form a contact electrode.

Such a vertical MOS transistor requires use of a chemical mechanical polishing (CMP) process for planarizing the surface of the structure in order to remove the step of the surface of the structure. Furthermore, since the gap between gate electrodes or the contacts has been gradually reduced due to obtain a highly integrated semiconductor device, a bridge may be formed between devices having a fine gap thereby. Therefore, there have been problems that the electrical characteristics and the yield of the semiconductor device may become deteriorated.

SUMMARY

Embodiments relate to a lateral metal oxide semiconductor (MOS) transistor and a method for manufacturing thereof that can prevent a formation of bridge due to a narrow gap between device structures in a highly integrated semiconductor device.

Embodiments relate to a lateral MOS transistor that can reduce the planarization process and reduce the generation of a bridge in using a lateral structure whereby a gate electrode is arranged in an etched groove having a predetermined depth of a device isolating layer of a semiconductor substrate and a source/drain region is arranged within the semiconductor substrate adjacent the gate electrode.

Embodiments relate to a method for manufacturing a lateral MOS transistor that can reduce the generation of a bridge in using a lateral structure whereby a groove having a predetermined depth is etched in a device isolating layer, a gate insulating layer and a gate electrode are formed in the groove, and a source/drain region is formed within the substrate adjacent thereto.

Embodiments relate to a lateral MOS transistor that can include a first device isolating layer formed in a semiconductor substrate; a second device isolating layer formed in the semiconductor substrate, the second device isolation layer having a different width than the first device isolation layer and also having an etched groove provided therein; a gate insulating layer formed in the etched groove; a gate electrode formed over the gate insulating layer; and a source/drain region horizontally arranged in the semiconductor substrate adjacent the gate electrode.

Embodiments relate to a method for manufacturing a lateral MOS transistor that can include at least one of the following steps: forming a first device isolating layer and a second device isolating layer having different widths in a semiconductor substrate; forming a groove in the second device isolating layer; forming a gate insulating layer in the etched groove; forming a gate electrode over the gate insulating layer to gap-fill the groove; and then forming at least one source/drain region horizontally arranged in the semiconductor substrate adjacent to the gate electrode.

Embodiments relate to a method for manufacturing a lateral MOS transistor that can include at least one of the following steps: forming a first device isolating layer and a second device isolating layer in a semiconductor substrate; forming a groove in the second device isolating layer; forming a gate insulating layer in the groove; forming a gate electrode connecting wiring over the gate insulating layer to gap-fill the groove; forming a gate electrode electrically connected to the gate electrode connecting wiring on a portion of the uppermost surface of the second device isolating layer; and then forming at least one source/drain region horizontally arranged in the semiconductor substrate adjacent to the gate electrode connecting wiring.

DRAWINGS

Example

Example

Example

Example FIGS. 4A to 4E sequentially illustrate a method for manufacturing a lateral MOS transistor in accordance with embodiments.

Example

Example

Example

DESCRIPTION

Figure 2:
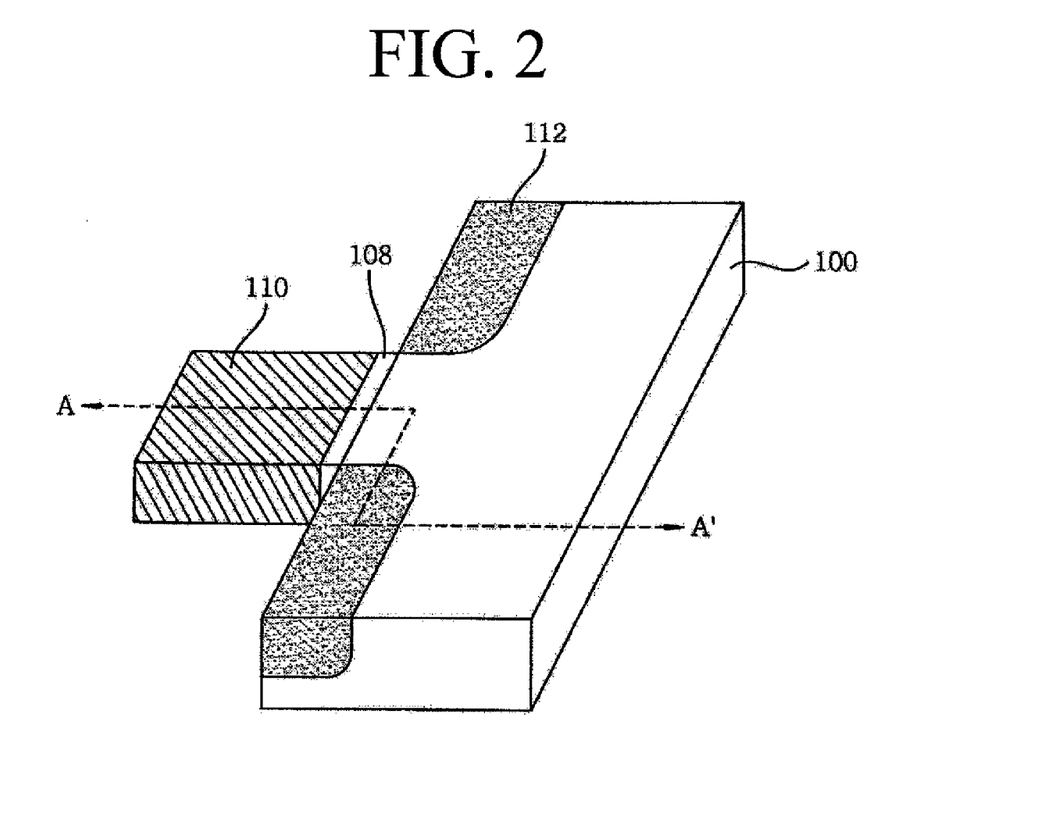
FIG. 2 illustrates a lateral MOS transistor, in accordance with embodiments.

As illustrated in example FIG. 2, in accordance with embodiments, a lateral MOS transistor may include a groove etched at a predetermined depth within a STI device isolating layer formed on and/or over semiconductor substrate 100. Semiconductor substrate 100 may be composed of a silicon substrate. Gate electrode 110 can be formed in the etched groove of the STI device isolating layer.

Gate insulating layer 108 can be formed on and/or over semiconductor substrate 100 in the etched groove within the STI device isolating layer and between source/drain regions 112. Source/drain regions 112 may be horizontally arranged within semiconductor substrate 100 adjacent gate electrode 110 and aligned in the edge of the gate electrode 110.

An interlayer dielectric layer can be formed on and/or over semiconductor substrate 100 having gate electrode 110 and source/drain region 112. A contact electrode can be vertically connected either to gate electrode 110 or source/drain region 112 through the contact hole of the interlayer dielectric layer. Because gate electrode 110 and source/drain region 112 may be formed concurrently, the surface of the interlayer dielectric layer can be planarized without using separate planarization processes.

Figure 3:
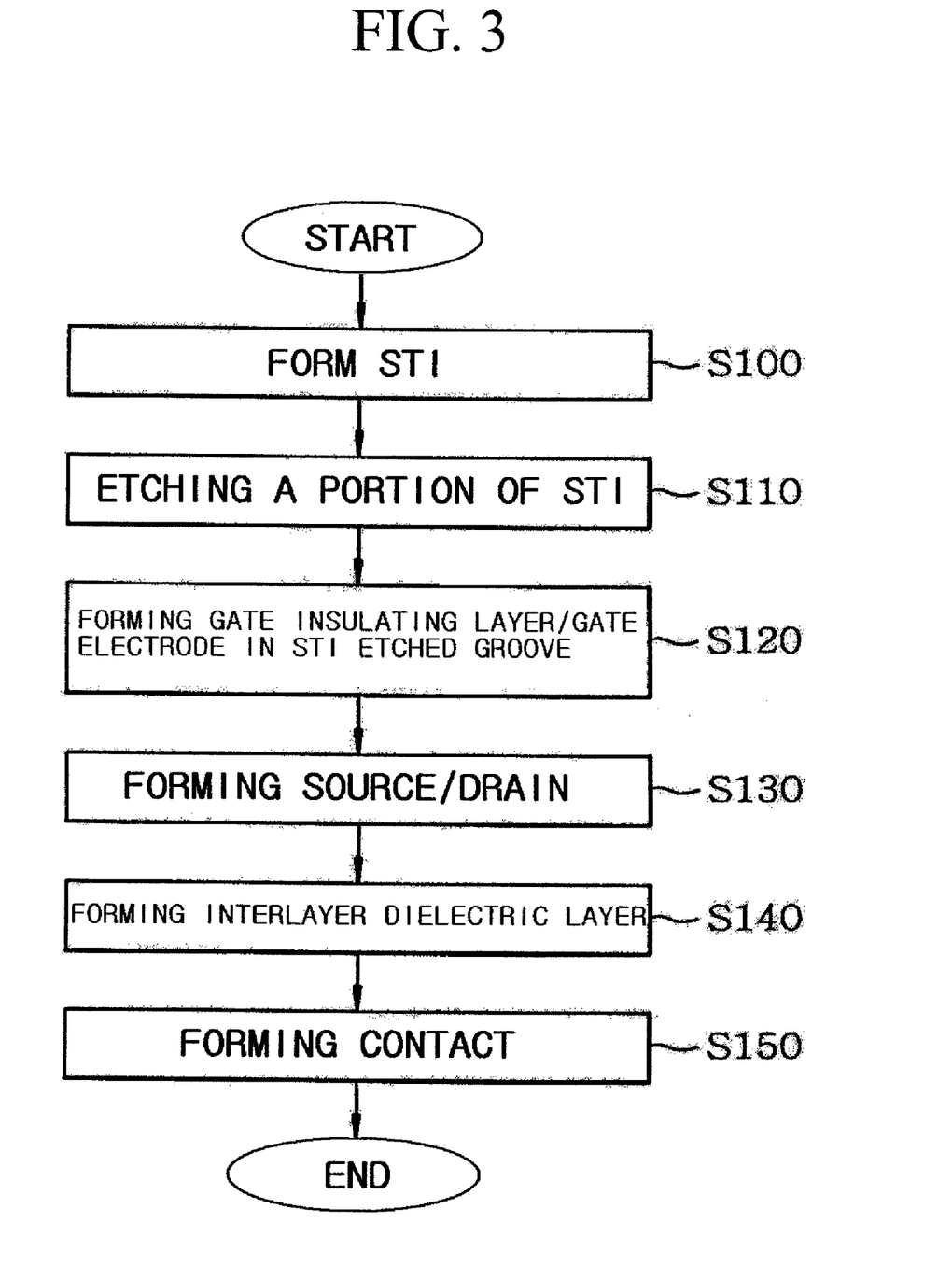
FIG. 3 illustrates a flow chart of a method for manufacturing a lateral MOS transistor, in accordance with embodiments.

As illustrated in example FIGS. 3 to 4, a method for manufacturing a lateral MOS transistor in accordance with embodiments may include the following. Step 100 (S100) can include performing a STI process on semiconductor substrate 100 to form first device isolating layer 102 and second device isolating layer 102a. Semiconductor substrate 100 may be composed of a silicon substrate. First device isolating layer 102 and second device isolating layer 102a may be sized to have different widths.

Figure 4A:
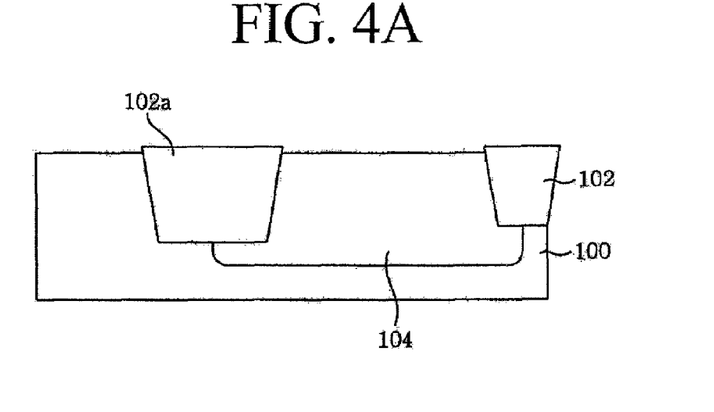

A low concentration impurity dopant such as a p-type impurity dopant can then be ion-implanted into substrate 100 at first device isolating layer 102 and second device isolating layer 102a to form well-region 104. The width of second device isolating layer 102a can be formed by adding the horizontal width of the gate electrode and the width of first device isolating layer 102 having the width according to a design rule.

An impurity dopant such as an n-type impurity dopant can be ion-implanted into well-region 104 of semiconductor substrate 100 to form a threshold voltage control region.

Figure 4B:
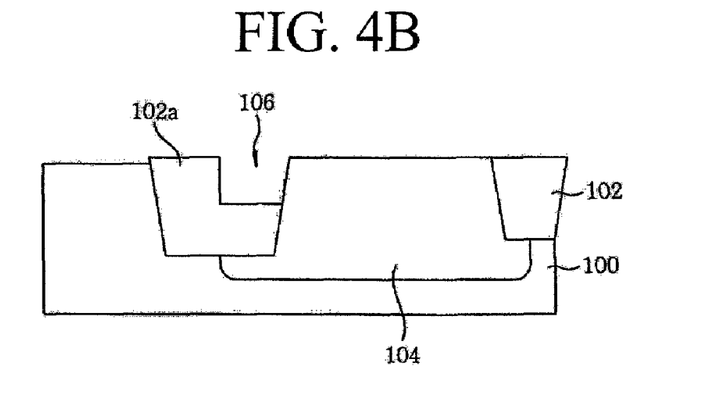

As illustrated in example FIG. 4B, step 110 (S110) may include using a mask pattern to remove a portion of any one edge surface of second device isolating layer 102a by performing a photolithographic process using a gate mask. Second device isolating layer 102a can be exposed using the mask pattern and etched at a predetermined depth to form etching groove 106. An ashing process can then be performed to remove the mask pattern.

Figure 4C:
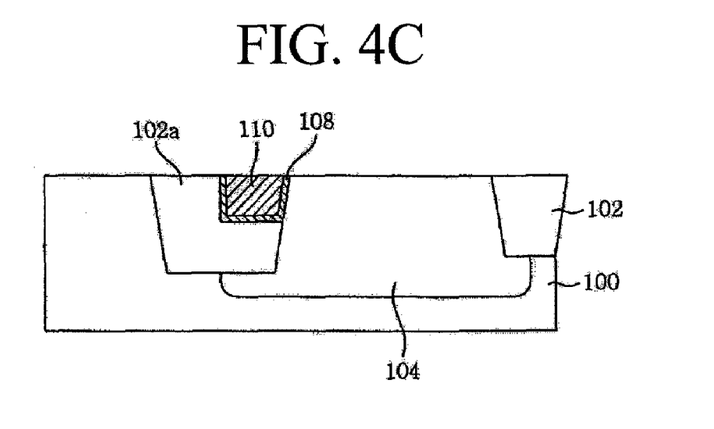

As illustrated in example FIG. 4C, step 120 (S120) can include forming gate insulating layer 108 in etched groove 106 of second device isolating layer 102a. Gate electrode 110 can then be formed in etched groove 106 on and/or over gate insulating layer 108 by gap-filling a conductive material such as doped polysilicon. Gate insulating layer 108 can be formed having a thin layer of silicon oxide film ($SiO_2$) using a thermal oxidation process and a chemical vapor deposition (CVD) method, etc.

Figure 4D:
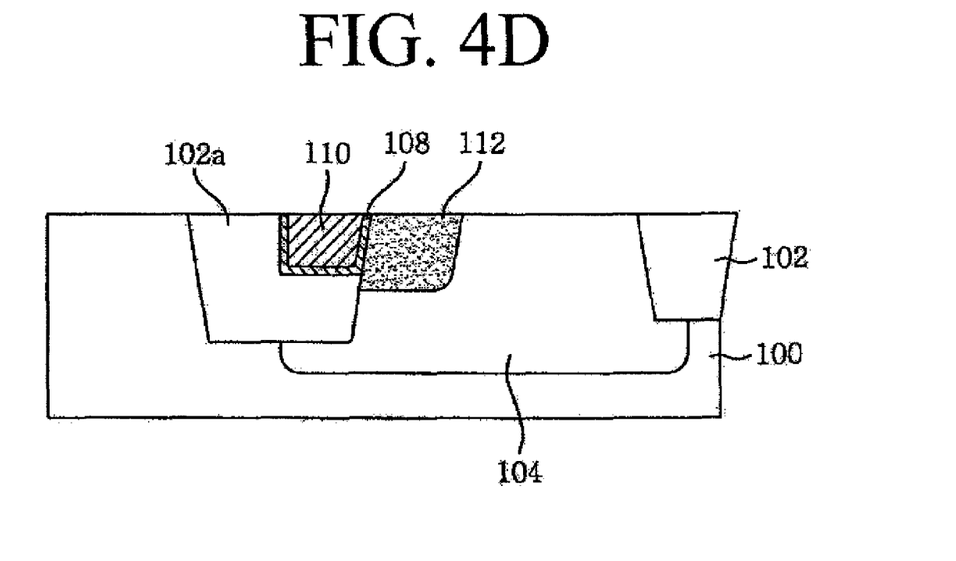

As illustrated in example FIG. 4D, step 130 (S130) can include forming source/drain region 112 by forming a mask pattern to remove a portion of well-region 104 by way of a photolithographic process using a source/drain mask and then ion-implanting a high concentration impurity dopant such as an n-type dopant into well region 104. An ashing process can then be performed to thereby remove the mask pattern. Source/drain region 112 can be horizontally arranged in semiconductor substrate 100 adjacent gate electrode 110 and aligned in each of the edge surfaces of gate electrode 110 to be isolated from each other. Before forming source/drain region 112, a low concentration impurity dopant such as an n-type impurity dopant can be implanted to form a LDD region.

Figure 4E:
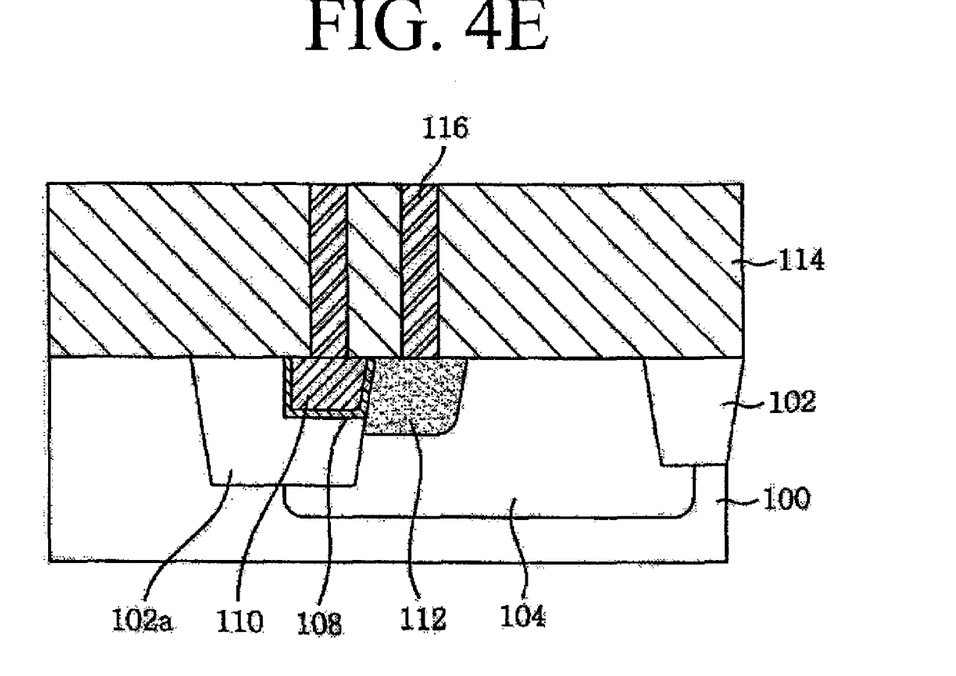

As illustrated in example FIG. 4E, step 140 (S140) can include forming interlayer dielectric layer 114 on and/or over semiconductor substrate 100 including first device isolation layer 102, second device isolation layer 102a, well region 104, gate insulating layer 108 and gate electrode 110. Interlayer dielectric layer 114 can be composed of at least one of PSG, BSG, BPSG, and USG. Although the uppermost surface of interlayer dielectric layer 114 has a step between gate electrode 110 and source/drain region 112, the step size is not large as compared to a vertical MOS transistor so that a separate planarization process such as a chemical mechanical polishing (CMP) process can be performed or otherwise omitted.

As illustrated in example FIG. 4E, step 150 (S15) can include forming a pair of contact electrodes 116 vertically extending through interlayer dielectric layer 114 and in electrical connection with gate electrode 110 and source/drain region 112. Contacts can be formed by performing a contact hole etching process on interlayer dielectric layer 114 to form a contact hole which exposes an uppermost surface of gate electrode 110 and an uppermost surface of source/drain region 112. A conductive layer composed of a metal such as tungsten (W) can then be gap-filled in the contact holes. The conductive layer can then be planarized using a chemical mechanical polishing (CMP) process to form contact electrodes 116.

In accordance with embodiments, before forming interlayer dielectric layer 114, the method for manufacturing a lateral MOS transistor can also include forming a silicide film such as titanium silicide (TiSi) on and/or over a portion of the uppermost surface of gate electrode 110 and/or the uppermost surface of source/drain region 112.

Figure 5:
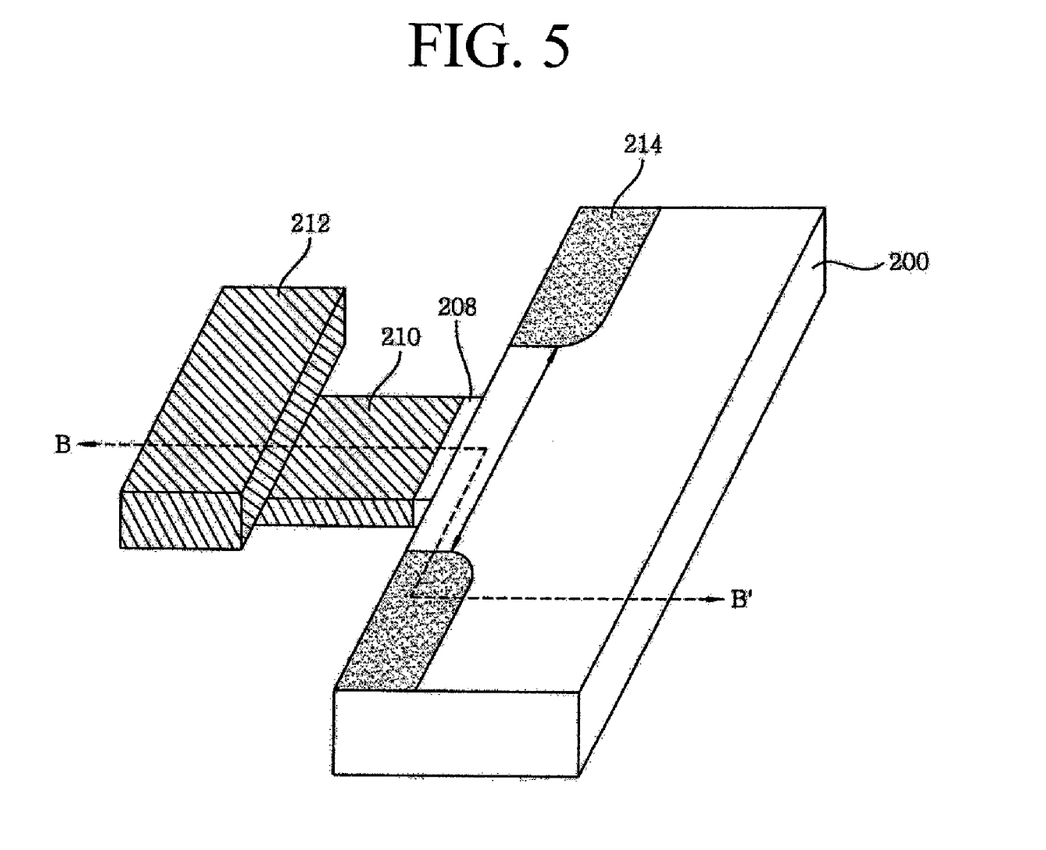
FIG. 5 illustrates a lateral MOS transistor, in accordance with embodiments.

As illustrated in example FIG. 5, in accordance with embodiments, a lateral MOS transistor can include a groove etched at a predetermined depth within an optional STI device isolating layer formed in semiconductor substrate 200. Gate electrode connecting wiring 210 can be formed in the etched groove of the STI device isolating layer. Gate insulating layer 208 can be formed beneath gate electrode connecting wiring 210 of the etched groove within the STI device isolating layer and adjacent source/drain region 214.

Gate electrode 212 can be vertically and electrically connected to a portion of the uppermost surface of gate electrode connecting wiring 210 in the opposite direction to the gate insulating layer 208. Source/drain region 214 can be horizontally arranged in semiconductor substrate 200 adjacent gate electrode connecting wiring 210 and aligned in the edge of gate electrode 212.

An interlayer dielectric layer can be formed on and/or over the semiconductor substrate structure including gate electrode 212 and source/drain region 214. A contact electrode can be vertically and electrically connected to the uppermost surface of gate electrode 212 and the uppermost surface of source/drain region 214 through the contact hole in the interlayer dielectric layer. Since gate electrode 212 and source/drain region 214 have the uppermost surface in the same plane, a separate planarization process such as a chemical mechanical polishing (CMP) process on the uppermost surface of the interlayer dielectric layer is not required.

Figure 6:
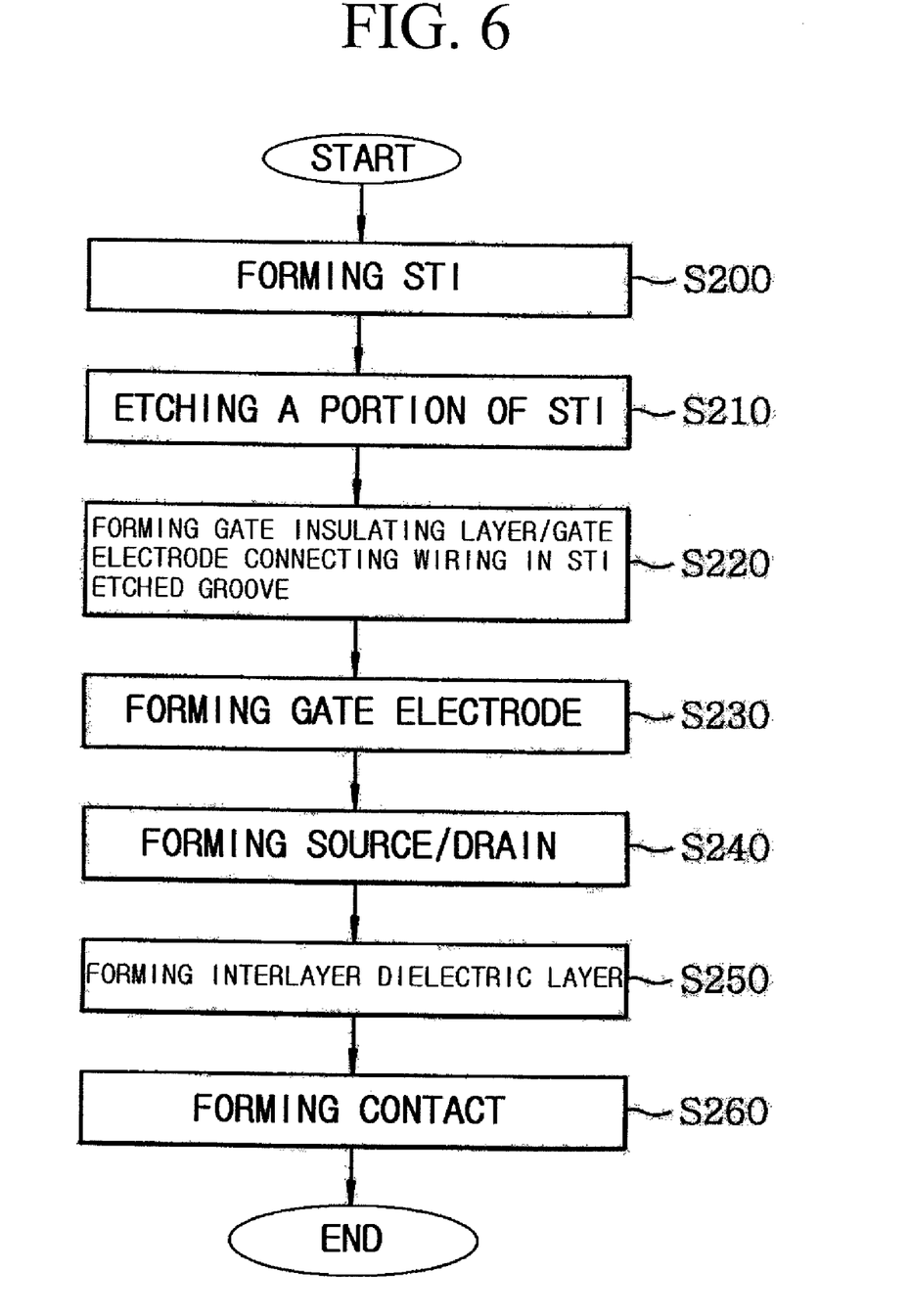
FIG. 6 illustrates a flow chart of a method for manufacturing a lateral MOS transistor in accordance with embodiments.
Figure 7:
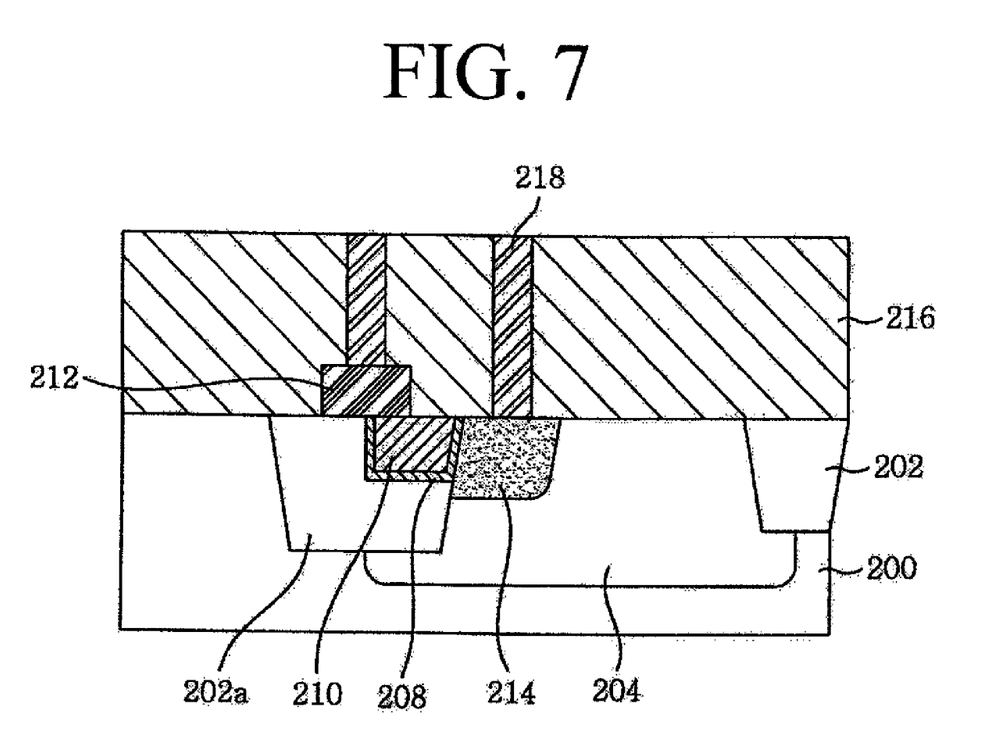
FIG. 7 illustrates a manufacturing process of a lateral MOS transistor, in accordance with embodiments.

As illustrated in example FIGS. 6 and 7, a method for manufacturing a lateral MOS transistor in accordance with embodiments can be provided as follows. The processes for forming well region 204, gate insulating layer 208, gate electrode connecting wiring 210, and source/drain region 214 as illustrated in example FIG. 7 are similar to those as shown in example FIGS. 4A to 4D, so that they will be described by way of reference.

Step 200 (S200) can include forming a pair of STI device isolation layers 202, 202a in semiconductor substrate 200. Semiconductor substrate 200 may be composed of a silicon substrate. STI device isolation layers 202, 202a can be formed by performing an STI process semiconductor substrate 200. First device isolating layer 202 and second device isolation layer 202a can have different widths with respect to each other. A low concentration impurity dopant such as a p-type impurity dopant can be ion-implanted into substrate 200 where first device isolating layer 202 and second device isolation layer 202a are formed to thereby form well-region 204.

The width of second device isolating layer 202a can be widely formed by adding the horizontal width of the gate electrode and the width of first device isolating layer 202 having the width according to a design rule. An impurity dopant such as an n-type impurity dopant can be ion-implanted into well-region 204 of semiconductor substrate 200 to form a threshold voltage control region.

Step 210 (S210) can include forming an etched groove. The etched groove can be formed by etching a portion of any one edge surface of second device isolating layer 202a at a predetermined depth.

Step 220 (S220) can include forming gate insulating layer 208 and gate electrode connecting wiring 210. Gate insulating layer 208 can be formed by thinly depositing an oxide film such as silicon oxide ($SiO_2$) inside the etched groove within second device isolating layer 202a. Gate electrode connecting wiring 210 can be formed by gap-filling into the etched groove a conductive layer material such as a doped polysilicon on and/or over gate insulating layer 208.

Step 230 (S230) can include forming gate electrode 212. Gate electrode 212 can be vertically and electrically connected to a portion of gate electrode connecting wiring 210, a portion of gate insulating layer 208 and a portion of gate electrode connecting wiring 210 by depositing and patterning a gate conductive layer such as doped polysilicon on and/or over a portion of the uppermost surface of second device isolating layer 202a.

Step 240 (S240) can include forming a pair of source/drain regions 214 in the semiconductor substrate 200. Source/drain regions can be formed by using a mask pattern to remove a portion of well region 204 and performing a photolithographic process using a source/drain mask. A high concentration impurity dopant such as an n-type dopant can be ion-implanted into the space of well region 104 to form source/drain regions 214. Source/drain regions 214 can be horizontally arranged within semiconductor substrate 200 adjacent to gate electrode connecting wiring 210 and have respective uppermost surfaces that lie in substantially the same plane as the uppermost surface of gate electrode 110.

Step 250 (S250) can include forming interlayer dielectric layer 216 on and/or over semiconductor substrate 200 including first device isolation layer 202, second device isolation layer 202a, well region 204, gate insulating layer 208, gate electrode connecting wiring 210, gate electrode 212 and source/drain regions 214. Interlayer dielectric layer 114 can be composed of at least one of PSG, BSG, BPSG, and USG. Although the uppermost surface of interlayer dielectric layer 216 has a step between gate electrode 212 and source/drain region 214, the step size is not large as compared to a vertical MOS transistor so that a separate planarization process such as a chemical mechanical polishing (CMP) process can be performed or otherwise omitted.

Step 260 (S260) can include forming a pair of contact electrodes 218 vertically extending through interlayer dielectric layer 216 and in electrical connection with gate electrode 212 and source/drain region 214. Contacts electrodes 218 can be formed by performing a contact hole etching process on interlayer dielectric layer 114 to form a pair of contact holes which expose an uppermost surface of gate electrode 212 and an uppermost surface of source/drain region 214. A conductive layer composed of a metal such as tungsten (W) can then be gap-filled in the contact holes. The conductive layer can then be planarized using a chemical mechanical polishing (CMP) process to form contact electrodes 116.

In accordance with embodiments, before forming source/drain region 214, a low concentration impurity dopant such as an n-type impurity dopant can be implanted to form a LDD region. Also, before depositing interlayer dielectric layer 216, a silicide film such as titanium silicide (TiSi) can be added or omitted on and/or over a portion of the uppermost surface of gate electrode 212 or the uppermost surface of source/drain region 214.

As described above, in accordance with embodiments a lateral metal oxide semiconductor (MOS) transistor can be fabricated by etching a groove within a device isolating layer at a predetermined depth in a semiconductor substrate, forming a gate insulating layer, a gate electrode and/or a gate electrode connecting wiring in the groove, and forming a source/drain region adjacent thereto. Such a structure can reduce generation of a bridge due to a fine gap between the gate electrodes or the contacts.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a first device isolating layer formed in a semiconductor substrate;
   a second device isolating layer formed in the semiconductor substrate, the second device isolation layer having a different width than the first device isolation layer and also having an etched groove provided therein;
   a gate insulating layer formed in the etched groove;
   a gate electrode formed over the gate insulating layer; and
   a source/drain region horizontally arranged in the semiconductor substrate adjacent the gate electrode,
   wherein the gate electrode and the source/drain region have uppermost surfaces in a substantially same plane as a uppermost surface of the semiconductor substrate.

2. The apparatus of claim 1, wherein the first device isolation layer and the second device isolating layer have an STI structure.

3. The apparatus of claim 1, wherein the width of the second isolating layer is larger than the combined widths of the first device isolating layer and the gate electrode.

4. The apparatus of claim 1, further comprising:
   an interlayer dielectric layer formed over the semiconductor substrate including the source/drain region and the gate electrode; and
   at least one contact electrode provided in the interlayer dielectric layer and electrically connected to at least one of the gate electrode and the source/drain region.

5. The apparatus of claim 4, wherein the interlayer dielectric layer is composed of at least one of PSG, BSG, BPSG, and USG.

6. A method comprising:
   forming a first device isolating layer and a second device isolating layer having different widths in a semiconductor substrate;
   forming a groove in the second device isolating layer;
   forming a gate insulating layer in the etched groove;
   forming a gate electrode over the gate insulating layer to gap-fill the groove; and then
   forming at least one source/drain region horizontally arranged in the semiconductor substrate adjacent to the gate electrode,
   wherein the gate electrode and the at least one source/drain region have uppermost surfaces in a substantially same plane as a uppermost surface of the semiconductor substrate.

7. The method of claim 6, wherein the first device isolating layer and the second device isolating layer are formed having a STI structure.

8. The method of claim 6, wherein the width of the second isolating layer is larger than the combined widths of the first device isolating layer and the gate electrode.

9. The method of claim 6, wherein the source/drain region is formed having an LDD structure.

10. The method of claim 6, wherein after forming the at least one source/drain region, further comprising:
    forming a silicide film over at least one of the gate electrode and the source/drain region.

11. The method of claim 10, further comprising:
    forming an interlayer dielectric layer over the semiconductor substrate including the silicide film formed over at least one of the gate electrode and the source/drain region;
    forming at least one contact hole in the interlayer dielectric layer; and
    forming a contact electrode in the at least one contact hole vertically and electrically connected to at least one of the gate electrode and the source/drain region.

12. A method comprising:
    forming a first device isolating layer and a second device isolating layer in a semiconductor substrate;
    forming a groove in the second device isolating layer;
    forming a gate insulating layer in the groove;
    forming a gate electrode connecting wiring over the gate insulating layer to gap-fill the groove;
    forming a gate electrode electrically connected to the gate electrode connecting wiring on a portion of the uppermost surface of the second device isolating layer; and then
    forming at least one source/drain region horizontally arranged in the semiconductor substrate adjacent to the gate electrode connecting wiring,
    wherein the gate electrode and the at least one source/drain region are spaced apart from each other through the gate electrode connecting wiring therebetween.

13. The method of claim 12, wherein after forming the at least one source/drain region, further comprising:
    forming a silicide film over at least one of the gate electrode and the source/drain region.

14. The method of claim 13, further comprising:
    forming an interlayer dielectric layer over the semiconductor substrate including the silicide film formed over at least one of the gate electrode and the source/drain region;
    forming at least one contact hole in the interlayer dielectric layer; and
    forming a contact electrode in the at least one contact hole vertically and electrically connected to at least one of the gate electrode and the source/drain region.

15. The method of claim 14, wherein the silicide film comprises titanium silicide.

16. The method of claim 15, wherein the interlayer dielectric layer is composed of at least one of PSG, BSG, BPSG, and USG.

17. The method according to claim 12, wherein the first device isolating layer and the second device isolating layer are formed having a STI structure.

18. The method according to claim 12, wherein the width of the second isolating layer is larger than the combined widths of the first device isolating layer and the gate electrode.

19. The method according to claim 15, wherein the source/drain region is formed having a LDD structure.

20. The method of claim 14, wherein the groove is formed by etching a portion of any one edge surface of the second device isolating layer to a predetermined depth.

* * * * *